(12) United States Patent
Tian et al.

(10) Patent No.: US 11,579,216 B1
(45) Date of Patent: Feb. 14, 2023

(54) MULTI-COLOR QUANTITATIVE MAGNETIC NANOPARTICLE IMAGING METHOD AND SYSTEM BASED ON TRAPEZOIDAL WAVE EXCITATION

(71) Applicant: Beijing University of Aeronautics and Astronautics, Beijing (CN)

(72) Inventors: Jie Tian, Beijing (CN); Yimeng Li, Beijing (CN); Hui Hui, Beijing (CN); Yu An, Beijing (CN); Jing Zhong, Beijing (CN); Bo Zhang, Beijing (CN)

(73) Assignee: Beijing University of Aeronautics and Astronautics, Beijing (CN)

( * ) Notice: Subject to any disclaimer, the term of this patent is extended or adjusted under 35 U.S.C. 154(b) by 0 days.

(21) Appl. No.: 17/877,945

(22) Filed: Jul. 31, 2022

(30) Foreign Application Priority Data

Apr. 22, 2022 (CN) .......................... 202210428813.5

(51) Int. Cl.
*G01R 33/12* (2006.01)
*G06T 11/00* (2006.01)

(52) U.S. Cl.
CPC ........ *G01R 33/1276* (2013.01); *G06T 11/008* (2013.01)

(58) Field of Classification Search
CPC .......................... G01R 33/1276; G06T 11/008
See application file for complete search history.

(56) References Cited

U.S. PATENT DOCUMENTS

| 2019/0079149 A1* | 3/2019 | Conolly ................. G01R 33/10 |
| 2019/0287277 A1 | 9/2019 | Franke | |

FOREIGN PATENT DOCUMENTS

| CN | 110755072 A | 2/2020 |
| CN | 112400115 A | 2/2021 |

(Continued)

OTHER PUBLICATIONS

Rauwerdink AM, Giustini AJ, Weaver JB. Simultaneous quantification of multiple magnetic nanoparticles. Nanotechnology. Nov. 12, 2010;21(45):455101 (Year: 2010).*

(Continued)

*Primary Examiner* — Daniel R Miller
(74) *Attorney, Agent, or Firm* — Bayramoglu Law Offices LLC

(57) ABSTRACT

A multi-color quantitative magnetic nanoparticle imaging method and system based on trapezoidal wave excitation solves the problem that the existing technology cannot implement multi-color quantitative magnetic particle imaging. The method includes: constructing, based on hysteresis effect and hysteresis inertial growth differences of n superparamagnetic iron oxide nanoparticles (SPIOs) under trapezoidal wave excitation, an equation set of quality of n SPIOs in a to-be-tested sample formed by any composition of n SPIO standard products; solving the equation set to obtain the quality distribution of the to-be-tested sample at position r; and performing rearrangement, color assignment, and image merging on the quality distribution to implement multi-color quantitative imaging of various particles in magnetic particle imaging (MPI). The method broadens the functions of MPI to realize multi-color quantitative imaging, such that MPI has greater potential for application in the medical field.

10 Claims, 4 Drawing Sheets

(56) References Cited

FOREIGN PATENT DOCUMENTS

WO  2012046157 A1  4/2012
WO  2020200911 A1  10/2020

OTHER PUBLICATIONS

Rahmer et al., First experimental evidence of the feasibility of multi-color magnetic particle imaging, Phys. Med. Biol. 60 (2015) 1775-1791 (Year: 2015).*

D. Hensley, P. Goodwill, L. Croft and S. Conolly, "Preliminary experimental X-space color MPI," 2015 5th International Workshop on Magnetic Particle Imaging (IWMPI), 2015, pp. 1-1 (Year: 2015).*

Haegele J, Vaalma S, Panagiotopoulos N, Barkhausen J, Vogt FM, Borgert J, Rahmer J. Multi-color magnetic particle imaging for cardiovascular interventions. Phys Med Biol. Aug. 21, 2016;61(16):N415-26 (Year: 2016).*

\* cited by examiner

MULTI-COLOR QUANTITATIVE MAGNETIC NANOPARTICLE IMAGING METHOD AND SYSTEM BASED ON TRAPEZOIDAL WAVE EXCITATION

CROSS REFERENCE TO THE RELATED APPLICATIONS

This application is based upon and claims priority to Chinese Patent Application No. 202210428813.5, filed on Apr. 22, 2022, the entire contents of which are incorporated herein by reference.

TECHNICAL FIELD

The present disclosure relates to the field of magnetic nanoparticle imaging and, in particular, to a multi-color quantitative magnetic nanoparticle imaging method and system based on trapezoidal wave excitation.

BACKGROUND

Magnetic particle imaging (MPI) is a novel medical imaging method that generates a field free point (FFP) or field free line (FFL) by constructing a gradient field, such that the superparamagnetic iron oxide nanoparticle (SPIO) at the FFP or FFL can produce a nonlinear magnetization response to an excitation magnetic field, while the SPIO in other regions are in a saturated state. In this way, a distribution state of the SPIO can be coded and reconstructed according to an induced voltage of a receiving coil. With its high sensitivity and resolution, MPI has great potential for applications in many disease studies, such as cardiovascular diseases, tumor detection, cell tracing, etc.

At present, in the field of MPI, the MPI image reconstruction with multiple types of particles is still in the initial stage of research, and there is no study on the quantitative calculation of different particles. However, it is necessary to obtain quantitative information of various particles in clinical applications. By labeling different cells with different SPIOs and distributing concentrations of different particles as a multi-color quantitative image, it can help physicians to quantitatively distinguish locations and quantities of different cells to accurately determine the disease.

In general, single-particle homochromatic imaging in the field of magnetic particle imaging cannot label different cells and thus cannot distinguish locations and quantities of different cells. There is an urgent need in this field for a method that can realize multi-color quantitative magnetic nanoparticle imaging to better quantitatively distinguish locations and quantities of different cells and accurately determine the disease.

SUMMARY

To solve the foregoing problem in the prior art, that is, the prior art cannot implement multi-color quantitative magnetic particle imaging, the present disclosure provides a multi-color quantitative magnetic nanoparticle imaging method based on trapezoidal wave excitation. The method includes:

step S10, obtaining response voltage signals of n SPIO standard products under trapezoidal wave excitation and a response voltage signal of a to-be-tested sample formed by any composition of the n SPIO standard products under trapezoidal wave excitation;

step S20, separately gridding the response voltage signals according to a moving track of a magnetic excitation region in a field of view, averaging voltage signals of the SPIO standard products in a central grid of the field of view based on an excitation cycle to obtain magnetization curves corresponding to n SPIO standard products, and averaging voltage signals in each grid of the to-be-tested sample based on the excitation cycle to obtain a magnetization curve corresponding to each grid;

step S30, solving hysteresis inertia coefficients of the n SPIO standard products according to an inertial growth relationship between the magnetization curves corresponding to the n SPIO standard products and the hysteresis inertia coefficients;

step S40, selecting points of n moments including an initial moment and an end moment of a high amplitude holding phase of trapezoidal waves from the magnetization curve corresponding to the to-be-tested sample at position r; constructing an equation set of quality of n SPIOs with reference to the hysteresis inertia coefficient of the n SPIO standard products; and solving the equation set to obtain the quality distribution of the to-be-tested sample at position r: $m_1(r), m_2(r), \ldots, m_n(r)$; and step S50, assigning a different color to each SPIO and performing quality rearrangement and distribution image merging on the quality distribution $m_1(r), m_2(r), \ldots, m_n(r)$ of the to-be-tested sample to obtain a multi-color quantitative magnetic nanoparticle image.

In some preferred embodiments, the trapezoidal waves are generated by a trapezoidal wave excitation module.

A rise time $t_u$, a holding time $t_k$, and a cycle $T_d$ of the trapezoidal waves are adjusted by using a resistance value and a capacitance value in the trapezoidal wave excitation module.

A maximum value $V_{out}$ of the trapezoidal waves is adjusted by using a reference input voltage $V_{ref}$ of the trapezoidal wave excitation module.

In some preferred embodiments, in step S10, the response voltage signals of the n SPIO standard products under trapezoidal wave excitation are obtained by using the following method:

preparing the n SPIO standard products in multi-color quantitative magnetic particle imaging, where each SPIO standard product has an ion concentration of 0.2 mg/mL and a volume of 0.1 mL;

placing any one of the SPIO standard products at a center of a field of view of the multi-color quantitative magnetic particle imaging;

obtaining a response voltage signal of the current SPIO standard product through mobile scanning measurement by the magnetic excitation region in the field of view; and traversing the n SPIO standard products to obtain response voltage signals $u_1, u_2, \ldots, u_n$.

In some preferred embodiments, in step S10, the response voltage signal of the to-be-tested sample under trapezoidal wave excitation is obtained by using the following method:

mixing the n SPIO standard products based on any composition to obtain a to-be-tested sample formed by the n SPIO standard products, where the total iron content of each SPIO is unknown and the distribution of SPIOs is unknown;

placing the to-be-tested sample at a center of a field of view of the multi-color quantitative magnetic particle imaging; and obtaining a response voltage signal $u_{meas}$ of the to-be-tested sample through mobile scanning measurement by the magnetic excitation region in the field of view.

In some preferred embodiments, in step S20, the magnetization curves corresponding to the n SPIO standard products are obtained by using the following method:

step S201, gridding the response voltage signals $u_1$, $u_2$, ..., $u_n$ of the n SPIO standard products under trapezoidal wave excitation with reference to the moving track of the magnetic excitation region in the field of view to discretize each of the response voltage signals $u_1$, $u_2$, ..., $u_n$ into a plurality of sections;

step S202, selecting discrete response voltage signals in the central grid of the field of view, and averaging, according to a plurality of excitation cycles of the signals, the signals in the plurality of excitation cycles to be signals of one cycle; and step S203, integrating the averaged response voltage signals to obtain magnetization curves $M_1(t)$, $M_2(t)$, ..., $M_n(t)$ corresponding to the n SPIO standard products.

In some preferred embodiments, in step S20, the magnetization curve corresponding to each grid is obtained by using the following method:

step S211, gridding the response voltage signal $u_{meas}$ of the to-be-tested sample under trapezoidal wave excitation with reference to the moving track of the magnetic excitation region in the field of view to discretize the response voltage signal $u_{meas}$ into a plurality of sections;

step S212, selecting discrete response voltage signals in grid r and averaging, according to a plurality of excitation cycles of the signals, the signals in the plurality of excitation cycles to be signals of one cycle;

step S213, integrating the averaged response voltage signals to obtain a magnetization curve $M_{meas}(r, t)$ corresponding to grid r; and step S214, traversing r grids to obtain a magnetization curve corresponding to each grid.

In some example embodiments, step S30 may include:

step S31, for an $i^{th}$ SPIO standard product in the n SPIO standard products, inertially increasing a magnetization vector $M_i(0)$ by using a hysteresis inertia coefficient $a_i$:

where at the initial moment t=0 of the high amplitude holding phase of the trapezoidal waves, the magnetization vector of the $i^{th}$ SPIO standard product varies over time as follows:

$$M_i(t) = M_i(0) + \frac{1}{2}a_i t;$$

and at the end moment $t=t_k$ of the high amplitude holding phase of the trapezoidal waves, the magnetization vector of the $i^{th}$ SPIO standard product varies over time as follows:

$$M_i(t_k) = M_i(0) + \frac{1}{2}a_i t_k;$$

step S32, solving an inertia coefficient $a_i$ of the $i^{th}$ SPIO standard product based on the magnetization vectors $M_i(0)$ and $M_i(t_k)$ and $t_k$; and step S33, traversing the n SPIO standard products to obtain hysteresis inertia coefficients $a_1$, $a_2$, ..., $a_n$ of the n SPIO standard products.

In some preferred embodiments, the equation set of the quality of the n SPIOs is as follows:

$$\begin{cases} M_{meas}(r, t|_{t=0}) = \sum_{i=1}^{n} m_i(r) M_i(0) \\ M_{meas}(r, t|_{t=t_1}) = M_{meas}(r, t|_{t=0}) + \frac{1}{2}t_1\left(\sum_{i=1}^{n} m_i(r) a_i\right) \\ \cdots \\ M_{meas}(r, t|_{t=t_{n-2}}) = M_{meas}(r, t|_{t=0}) + \frac{1}{2}t_{n-2}\left(\sum_{i=1}^{n} m_i(r) a_i\right) \\ M_{meas}(r, t|_{t=t_k}) = M_{meas}(r, t|_{t=0}) + \frac{1}{2}t_k\left(\sum_{i=1}^{n} m_i(r) a_i\right) \end{cases}$$

where t=0 represents the initial moment of the high amplitude holding phase of the trapezoidal waves; $t=t_k$ represents the end moment of the high amplitude holding phase of the trapezoidal waves; $t=t_1$, ... $t=t_{n-2}$ represents n+2 moments from the initial moment t=0 to the end moment $t=t_k$; $M_i(0)$ represents a magnetization vector of an $i^{th}$ SPIO at the moment t=0, where i=1, 2, ..., n; $m_i(r)$ represents quality of the $i^{th}$ SPIO at position r, where i=1, 2, ..., n; and $a_i$ represents a hysteresis inertia coefficient of the $i^{th}$ SPIO, where i=1, 2, ..., n.

In some preferred embodiments, step S50 includes:

step S51, assigning a different color to each SPIO;

step S52, rearranging the quality $m_1(r)$, $m_2(r)$, ..., $m_n(r)$ of the to-be-tested sample at position r according to the moving track of the magnetic excitation region in the field of view to obtain quantitative distribution images $IMG_1$, $IMG_2$, ..., $IMG_n$; and step S53, merging the quantitative distribution images $IMG_1$, $IMG_2$, ..., $IMG_n$ to obtain the multi-color quantitative magnetic nanoparticle image $IMG_{merge}$.

According to another aspect, the present disclosure provides a multi-color quantitative magnetic nanoparticle imaging system based on trapezoidal wave excitation, including the following modules:

a response signal obtaining module configured to obtain response voltage signals of n SPIO standard products under trapezoidal wave excitation and a response voltage signal of a to-be-tested sample formed by any composition of the n SPIO standard products under trapezoidal wave excitation;

a magnetization curve generating module configured to separately grid the response voltage signals according to a moving track of a magnetic excitation region in a field of view, average voltage signals of the SPIO standard products in a central grid of the field of view based on an excitation cycle to obtain magnetization curves corresponding to the n SPIO standard products, and average voltage signals in each grid of the to-be-tested sample based on the excitation cycle to obtain a magnetization curve corresponding to each grid;

a hysteresis inertia coefficient obtaining module configured to solve hysteresis inertia coefficients of the n SPIO standard products according to an inertial growth relationship between the magnetization curves corresponding to the n SPIO standard products and the hysteresis inertia coefficients;

a to-be-tested sample quality solution module configured to select points of n moments including an initial moment and an end moment of a high amplitude holding phase of trapezoidal waves from the magnetization curve corresponding to grid r of the to-be-tested sample; construct an equation set of quality of n SPIOs with reference to the hysteresis inertia coefficients of the n SPIO standard products, and solve the equation set; and traverse r grids to obtain quality distribution of the to-be-tested sample: $m_1(r)$, $m_2(r)$, ..., $m_n(r)$; and a multi-color quantitative magnetic particle imaging module configured to assign a different color to each SPIO and perform quality rearrangement and distribution image merging on the quality distribution $m_1(r), m_2(r), \ldots, m_n(r)$ of the to-be-tested sample to obtain a multi-color quantitative magnetic nanoparticle image.

The present disclosure has the following beneficial effects:

In the multi-color quantitative magnetic nanoparticle imaging method based on trapezoidal wave excitation of the present disclosure, trapezoidal wave excitation enables the SPIO to have a hysteresis effect, and the magnetization vector in the high amplitude holding phase can increase with a certain hysteresis inertia coefficient. According to a hysteresis inertial growth phase of the magnetization vector, an equation set about the quality of different SPIOs can be constructed, thereby solving the quality of each type of particle to implement multi-color quantization of the MPI image. The present disclosure makes up for the deficiency that the current MPI study cannot implement quantitative calculation of multiple SPIOs and broadens the functions of MPI to realize multi-color quantitative imaging, such that MPI has greater potential for application in the medical field. In addition, the present disclosure can facilitate the application of complex magnetic nanoparticle probes in MPI and can achieve precise localization and quantification of a probe with a mixture of multiple SPIOs, which is in line with the development needs and direction of precision medicine.

BRIEF DESCRIPTION OF THE DRAWINGS

Other features, objectives, and advantages of the present disclosure will become more apparent upon reading the detailed description of the non-limiting embodiments with reference to the following drawings.

DETAILED DESCRIPTION OF THE EMBODIMENTS

Figure 1:
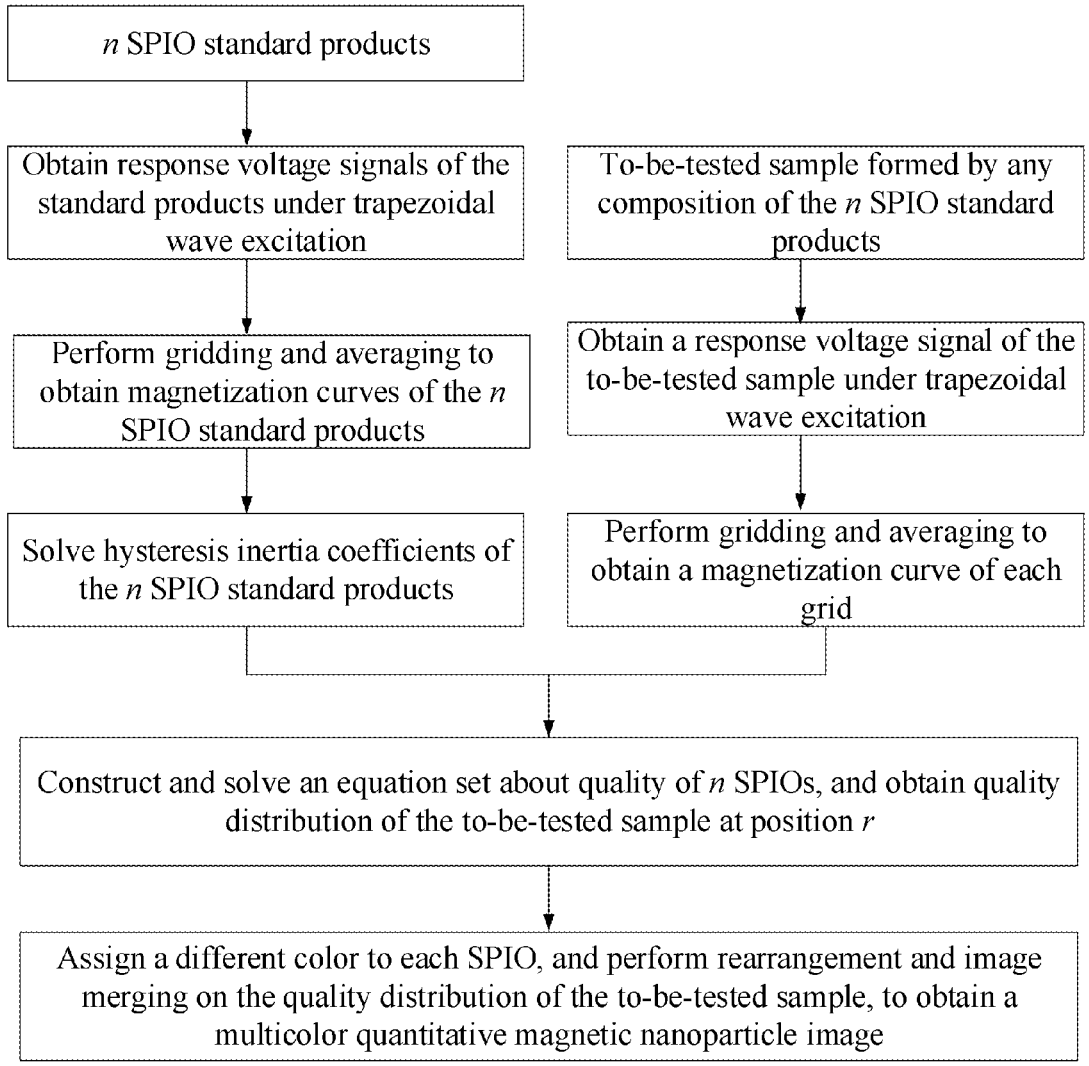
FIG. 1 is a schematic flowchart of a multi-color quantitative magnetic nanoparticle imaging method based on trapezoidal wave excitation according to the present disclosure.

The present disclosure will be further described in detail below with reference to the drawings and embodiments. It should be understood that the specific embodiments described herein are merely intended to explain the present disclosure, rather than to limit the present disclosure. It should also be noted that, for convenience of description, only the parts related to the present disclosure are shown in the drawings.

It should be noted that the embodiments in the present disclosure and features in the embodiments may be combined with each other if no conflict occurs. The present disclosure will be described in detail below with reference to the drawings and embodiments.

The present disclosure provides a multi-color quantitative magnetic nanoparticle imaging method based on trapezoidal wave excitation. At the FFP of MPI, the method generates a trapezoidal wave excitation field by using a trapezoidal wave generating circuit, such that different SPIOs have hysteresis magnetization under trapezoidal wave excitation. By detecting voltage signals received by coils, magnetization vectors of all the SPIOs are solved in a reverse direction. With reference to the hysteresis characteristics of different SPIOs under trapezoidal wave excitation, concentration distribution and quantitative information of different SPIOs are reconstructed, thereby implementing multi-color quantitative MPI.

A multi-color quantitative magnetic nanoparticle imaging method based on trapezoidal wave excitation of the present disclosure includes the following steps:

Step S10: Obtain response voltage signals of n SPIO standard products under trapezoidal wave excitation and a response voltage signal of a to-be-tested sample formed by any composition of the n SPIO standard products under trapezoidal wave excitation.

Step S20: Separately grid the response voltage signals according to a moving track of a magnetic excitation region in a field of view, average voltage signals of the SPIO standard products in a central grid of the field of view based on an excitation cycle to obtain magnetization curves corresponding to the n SPIO standard products, and average voltage signals in each grid of the to-be-tested sample based on the excitation cycle to obtain a magnetization curve corresponding to each grid.

Step S30: Solve hysteresis inertia coefficients of the n SPIO standard products according to an inertial growth relationship between the magnetization curves corresponding to the n SPIO standard products and the hysteresis inertia coefficients.

Step S40: Select points of n moments including an initial moment and an end moment of a high amplitude holding phase of trapezoidal waves from the magnetization curve corresponding to the to-be-tested sample at position r; construct an equation set of quality of n SPIOs with reference to the hysteresis inertia coefficient of the n SPIO standard products; and solve the equation set to obtain quality distribution of the to-be-tested sample at position r: $m_1(r), m_2(r), \ldots, m_n(r)$.

Step S50: Assign a different color to each SPIO and perform quality rearrangement and distribution image merging on the quality distribution $m_1(r), m_2(r), \ldots, m_n(r)$ of the to-be-tested sample to obtain a multi-color quantitative magnetic nanoparticle image.

To describe the multi-color quantitative magnetic nanoparticle imaging method based on trapezoidal wave excitation of the present disclosure more clearly, the following describes the steps in the embodiments of the present disclosure in detail with reference to FIG. 1.

The multi-color quantitative magnetic nanoparticle imaging method based on trapezoidal wave excitation according to a first embodiment of the present disclosure includes step S10 to step S50, which are described in detail as follows:

Step S10: Obtain response voltage signals of n SPIO standard products under trapezoidal wave excitation and a response voltage signal of a to-be-tested sample formed by any composition of the n SPIO standard products under trapezoidal wave excitation.

A multi-color quantitative magnetic nanoparticle imaging system includes a gradient scanning integrated module, a trapezoidal wave excitation module, and a signal receiving module.

The gradient scanning integrated module constructs an FFP by introducing a direct current to symmetrical coils and then introduce a low-frequency cosine current, such that the FFP region can move along the entire field of view (FOV), thereby scanning the entire FOV.

Figure 2:
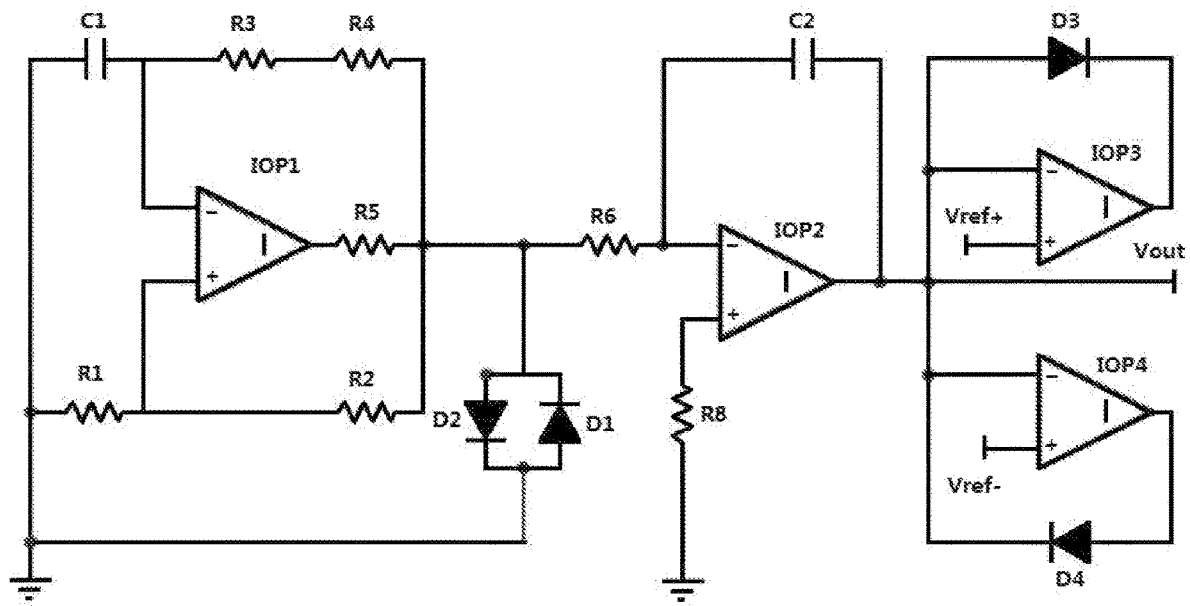
FIG. 2 is a principle diagram of a trapezoidal wave generating circuit in an embodiment of a multi-color quantitative magnetic nanoparticle imaging method based on trapezoidal wave excitation according to the present disclosure.

The trapezoidal wave excitation module is configured to generate trapezoidal waves. FIG. 2 is a principle diagram of a trapezoidal wave generating circuit in an embodiment of a multi-color quantitative magnetic nanoparticle imaging method based on trapezoidal wave excitation according to the present disclosure. The trapezoidal wave excitation module includes a trapezoidal wave generating circuit and a power amplifier. FIG. 2 only shows a principle diagram of one trapezoidal wave generating circuit, and trapezoidal wave generating circuits of other structures can be selected based on different application scenarios, which are not described in detail herein.

Figure 3:
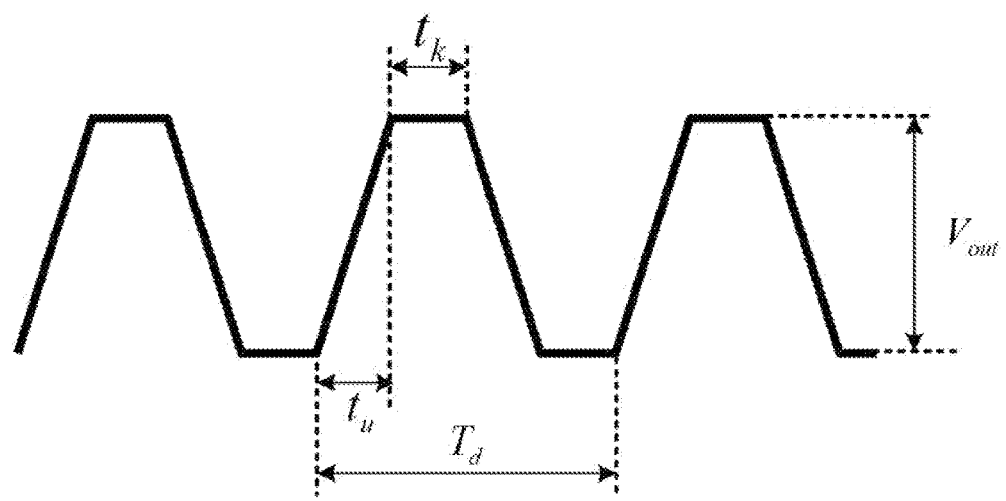
FIG. 3 is a schematic diagram of trapezoidal waves in an embodiment of a multi-color quantitative magnetic nanoparticle imaging method based on trapezoidal wave excitation according to the present disclosure.

FIG. 3 is a schematic diagram of trapezoidal waves in an embodiment of a multi-color quantitative magnetic nanoparticle imaging method based on trapezoidal wave excitation according to the present disclosure. The trapezoidal waves are generated by the trapezoidal wave generating circuit shown in FIG. 2. A rise time $t_a$, a holding time $t_k$, and a cycle $T_d$ of the trapezoidal waves are adjusted by using a resistance value and a capacitance value in the trapezoidal wave excitation module; a maximum value $V_{out}$ of the trapezoidal waves is adjusted by using a reference input voltage $V_{ref}$ of the trapezoidal wave excitation module.

The signal receiving module includes a receiving coil and a data acquisition circuit to acquire and store signals generated by the SPIOs.

In step S10, the response voltage signals of the n SPIO standard products under trapezoidal wave excitation are obtained by using the following method:

preparing the n SPIO standard products in multi-color quantitative magnetic particle imaging, where each SPIO standard product has an ion concentration of 0.2 mg/mL and a volume of 0.1 mL;

placing any one of the SPIO standard products at a center of a field of view of the multi-color quantitative magnetic particle imaging;

obtaining a response voltage signal of the current SPIO standard product through mobile scanning measurement by the magnetic excitation region in the field of view; and traversing the n SPIO standard products to obtain response voltage signals $u_1, u_2, \ldots, u_n$.

In step S10, the response voltage signal of the to-be-tested sample under trapezoidal wave excitation is obtained by using the following method:

mixing the n SPIO standard products based on any composition to obtain a to-be-tested sample formed by the n SPIO standard products, where the total iron content of each SPIO is unknown and the distribution of SPIOs is unknown;

placing the to-be-tested sample at a center of a field of view of multi-color quantitative magnetic particle imaging; and obtaining a response voltage signal $u_{meas}$ of the to-be-tested sample through mobile scanning measurement by the magnetic excitation region in the field of view.

Step S20: Separately grid the response voltage signals according to a moving track of a magnetic excitation region in a field of view, average voltage signals of the SPIO standard products in a central grid of the field of view based on an excitation cycle to obtain magnetization curves corresponding to the n SPIO standard products, and average voltage signals in each grid of the to-be-tested sample based on the excitation cycle to obtain a magnetization curve corresponding to each grid.

In step S20, the magnetization curves corresponding to the n SPIO standard products are obtained by using the following method:

Step S201: Grid the response voltage signals $u_1, u_2, \ldots, u_n$ of the n SPIO standard products under trapezoidal wave excitation with reference to the moving track of the magnetic excitation region in the field of view to discretize each of the response voltage signals $u_1, u_2, \ldots, u_n$ into a plurality of sections.

Step S202: Select discrete response voltage signals in the central grid of the field of view and average, according to a plurality of excitation cycles of the signals, the signals in the plurality of excitation cycles to be signals of one cycle.

Step S203: Integrate the averaged response voltage signals to obtain magnetization curves $M_1(t), M_2(t), \ldots, M_n(t)$ corresponding to the n SPIO standard products.

In step S20, the magnetization curve corresponding to each grid is obtained by using the following method:

Step S211: Grid the response voltage signal $u_{meas}$ of the to-be-tested sample under trapezoidal wave excitation with reference to the moving track of the magnetic excitation region in the field of view to discretize the response voltage signal $u_{meas}$ into a plurality of sections.

Step S212: Select discrete response voltage signals in grid r, and average, according to a plurality of excitation cycles of the signals, the signals in the plurality of excitation cycles to be signals of one cycle.

Step S213: Integrate the averaged response voltage signals to obtain a magnetization curve $M_{meas}(r, t)$ corresponding to grid r.

Step S214: Traverse r grids to obtain a magnetization curve corresponding to each grid.

Step S30: Solve hysteresis inertia coefficients of the n SPIO standard products according to an inertial growth relationship between the magnetization curves corresponding to the n SPIO standard products and the hysteresis inertia coefficients.

Figure 4:
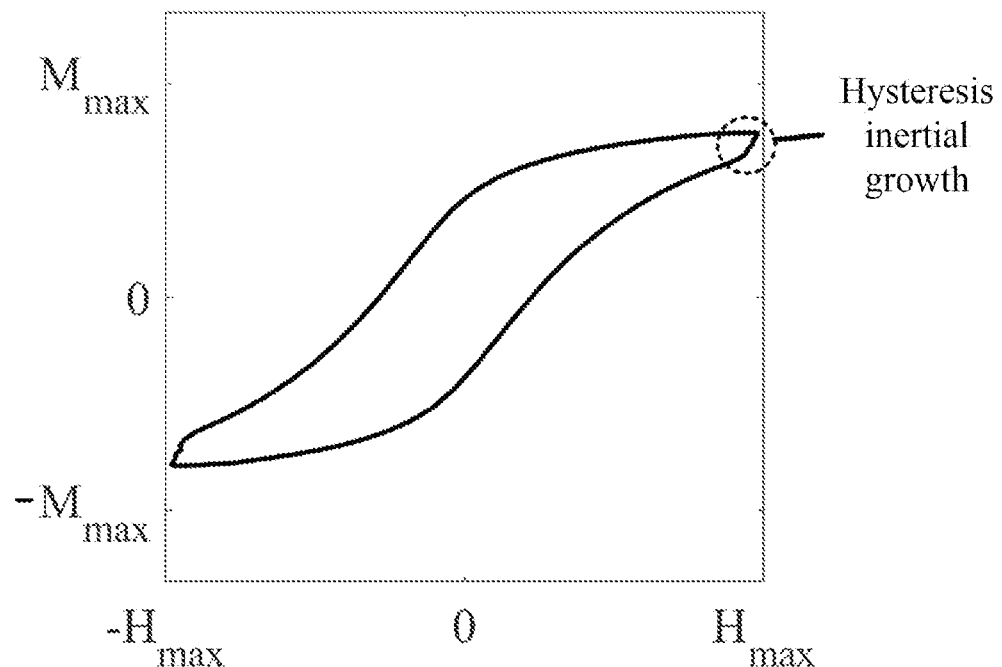
FIG. 4 is a schematic diagram of a hysteresis loop and a hysteresis growth phase under trapezoidal wave excitation in an embodiment of a multi-color quantitative magnetic nanoparticle imaging method based on trapezoidal wave excitation according to the present disclosure.

FIG. 4 is a schematic diagram of a hysteresis loop and a hysteresis growth phase under trapezoidal wave excitation in an embodiment of a multi-color quantitative magnetic nanoparticle imaging method based on trapezoidal wave excitation according to the present disclosure. Under a trapezoidal wave excitation magnetic field, the SPIO standard product has a hysteresis effect, where Mmax represents an amplitude value of a maximum magnetization vector, −Mmax represents an amplitude value of a minimum magnetization vector, Hmax represents an amplitude value of a maximum excitation magnetic field intensity, and −Hmax represents an amplitude value of a minimum excitation magnetic field intensity.

Step S31: For an $i^{th}$ SPIO standard product in the n SPIO standard products, inertially increase a magnetization vector $M_i(0)$ by using a hysteresis inertia coefficient $a_i$:

At the initial moment t=0 of the high amplitude holding phase of the trapezoidal waves, the magnetization vector of the $i^{th}$ SPIO standard product varies over time as shown in formula (1):

$$M_i(t) = M_i(0) + \frac{1}{2}a_i t \qquad (1)$$

At the end moment $t=t_k$ of the high amplitude holding phase of the trapezoidal waves, the magnetization vector of the $i^{th}$ SPIO standard product varies over time as shown in formula (2):

$$M_i(t_k) = M_i(0) + \frac{1}{2}a_i t_k \qquad (2)$$

Figure 5:
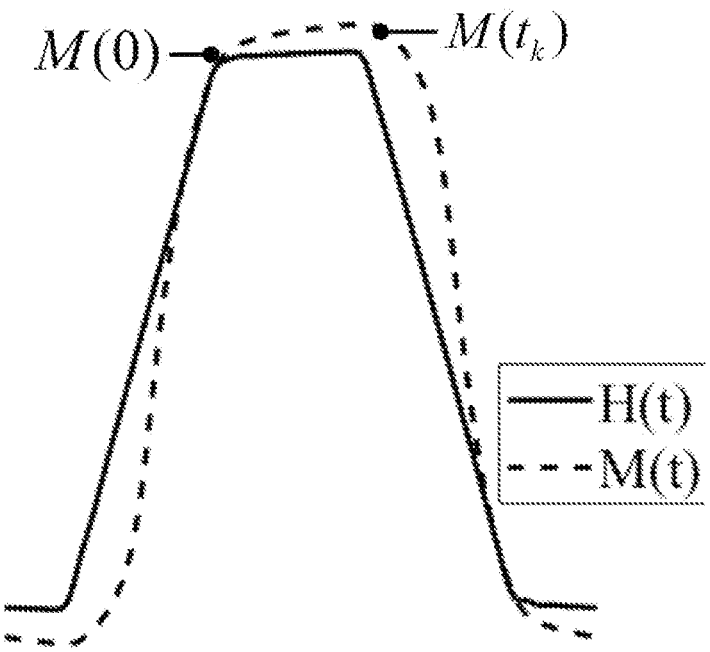
FIG. 5 shows a standard product magnetization curve under trapezoidal wave excitation in an embodiment of a multi-color quantitative magnetic nanoparticle imaging method based on trapezoidal wave excitation according to the present disclosure.

Step S32: Solve an inertia coefficient $a_i$ of the $i^{th}$ SPIO standard product based on the magnetization vectors $M_i(0)$ and $M_i(t_k)$ and $t_k$. FIG. 5 shows a standard product magnetization curve under trapezoidal wave excitation in an embodiment of a multi-color quantitative magnetic nanoparticle imaging method based on trapezoidal wave excitation according to the present disclosure.

Step S33: Traverse the n SPIO standard products to obtain hysteresis inertia coefficients $a_1, a_2, \ldots, a_n$ of the n SPIO standard products.

Step S40: Select points of n moments including an initial moment and an end moment of a high amplitude holding phase of trapezoidal waves from the magnetization curve corresponding to the to-be-tested sample at position r; construct an equation set of quality of n SPIOs with reference to the hysteresis inertia coefficient of the n SPIO standard products; and solve the equation set to obtain the quality distribution of the to-be-tested sample at position r: $m_1(r), m_2(r), \ldots, m_n(r)$ The to-be-tested sample still has a hysteresis effect under the trapezoidal wave excitation magnetic field. For position r, in the high amplitude holding phase of the trapezoidal waves, the magnetization vector of the to-be-tested sample has a hysteresis inertia, and the magnetization vector $M_{meas}(r, 0)$ of the standard product is increased inertially based on a hysteresis inertia coefficient $a_{meas}$.

At the initial moment t=0 of the high amplitude holding phase of the trapezoidal waves, the magnetization vector varies over time as shown in formula (3):

$$M_{meas}(r, t) = M_{meas}(r, 0) + \frac{1}{2}a_{meas}(r)t \qquad (3)$$

At the end moment $t=t_k$ of the high amplitude holding phase of the trapezoidal waves, the magnetization vector varies over time as shown in formula (4):

$$M_{meas}(r, t_k) = M_{meas}(r, 0) + \frac{1}{2}a_{meas}(r)t_k \qquad (4)$$

Figure 6:
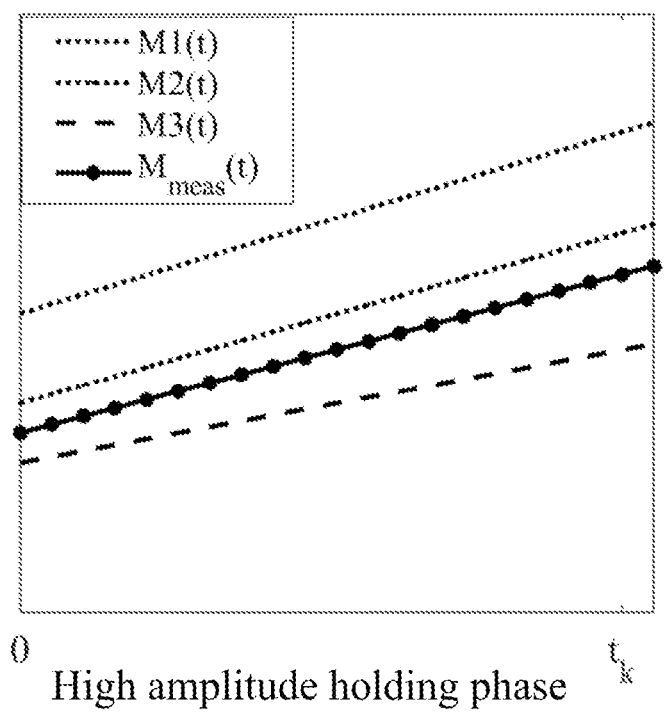
FIG. 6 shows the magnetization vector curves over time corresponding to standard products and a to-be-tested sample in a high amplitude holding phase in an embodiment of a multi-color quantitative magnetic nanoparticle imaging method based on trapezoidal wave excitation according to the present disclosure.

According to the quantity n of SPIO types contained in the to-be-tested sample, n points are selected from the curve $M_{meas}(r, t)$. FIG. 6 shows the magnetization vector curves over time corresponding to standard products and a to-be-tested sample in a high amplitude holding phase in an embodiment of a multi-color quantitative magnetic nanoparticle imaging method based on trapezoidal wave excitation according to the present disclosure. The selected n points are n points including, but not limited to, points $M_{meas}(r, 0)$ and $M_{meas}(r, t_k)$ on the curve, and an equation set about the quality of each SPIO is constructed, as shown in formula (5):

$$\begin{cases} M_{meas}(r, t|_{t=0}) = \sum_{i=1}^{n} m_i(r)M_i(0) \\ M_{meas}(r, t|_{t=t_1}) = M_{meas}(r, t|_{t=0}) + \frac{1}{2}t_1\left(\sum_{i=1}^{n} m_i(r)a_i\right) \\ \ldots \\ M_{meas}(r, t|_{t=t_{n-2}}) = M_{meas}(r, t|_{t=0}) + \frac{1}{2}t_{n-2}\left(\sum_{i=1}^{n} m_i(r)a_i\right) \\ M_{meas}(r, t|_{t=t_k}) = M_{meas}(r, t|_{t=0}) + \frac{1}{2}t_k\left(\sum_{i=1}^{n} m_i(r)a_i\right) \end{cases} \qquad (5)$$

where t=0 represents the initial moment of the high amplitude holding phase of the trapezoidal waves; $t=t_k$ represents the end moment of the high amplitude holding phase of the trapezoidal waves; $t=t_1, \ldots t=t_{n-2}$ represents n−2 moments from the initial moment t=0 to the end moment $t=t_k$; $M_i(0)$ represents a magnetization vector of an $i^{th}$ SPIO at the moment t=0, where i=1, 2, . . . , n; $m_i(r)$ represents the quality of the $i^{th}$ SPIO at position r, where i=1, 2, . . . , n; and $a_i$ represents a hysteresis inertia coefficient of the $i^{th}$ SPIO, where i=1, 2, . . . , n.

Step S50: Assign a different color to each SPIO and perform quality rearrangement and distribution image merging on the quality distribution $m_1(r), m_2(r), \ldots, m_n(r)$ of the to-be-tested sample to obtain a multi-color quantitative magnetic nanoparticle image:

Step S51: Assign a different color to each SPIO.

Step S52: Rearrange the quality $m_1(r), m_2(r), \ldots, m_n(r)$ of the to-be-tested sample at position r according to the moving track of the magnetic excitation region in the field of view to obtain quantitative distribution images $IMG_1, IMG_2, \ldots, IMG_n$.

Step S53: Merge the quantitative distribution images $IMG_1, IMG_2, \ldots, IMG_n$, to obtain the multi-color quantitative magnetic nanoparticle image $IMG_{merge}$.

Figure 7:
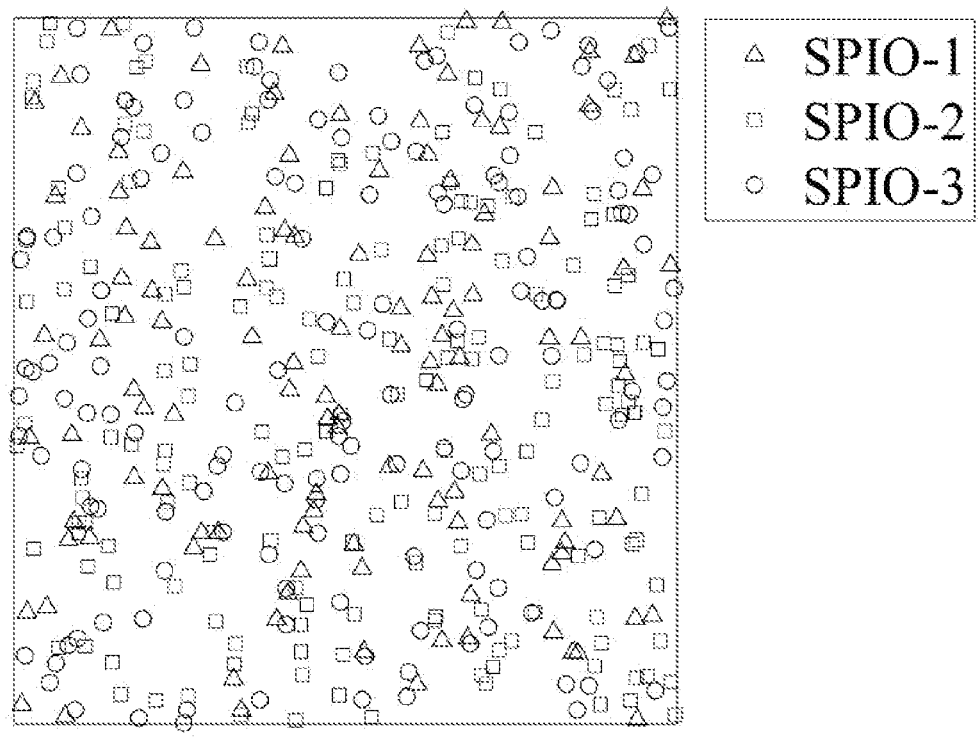
FIG. 7 shows a multi-color quantitative magnetic nanoparticle image in an embodiment of a multi-color quantitative magnetic nanoparticle imaging method based on trapezoidal wave excitation according to the present disclosure.

FIG. 7 shows a multi-color quantitative magnetic nanoparticle image in an embodiment of a multi-color quantitative magnetic nanoparticle imaging method based on trapezoidal wave excitation according to the present disclosure. In the process of multi-color quantitative magnetic particle imaging, three SPIO standard products are adopted: SPIO-1, SPIO-2, and SPIO-3, where SPIO-1 is denoted by triangles in the multi-color quantitative magnetic nanoparticle image; SPIO-2 is denoted by rectangles in the multi-color quantitative magnetic nanoparticle image; and SPIO-3 is denoted by circles in the multi-color quantitative magnetic nanoparticle image. In practical application, the standard products in the multi-color quantitative magnetic nanoparticle image are displayed in different colors.

These steps are described in order in the above embodiments. However, those skilled in the art may understand that, in order to achieve the effects of these embodiments, different steps may not be necessarily executed in such an order, but may be executed simultaneously (in parallel) or in a reversed order. These simple changes should fall within the protection scope of the present disclosure.

A second embodiment of the present disclosure provides a multi-color quantitative magnetic nanoparticle imaging system based on trapezoidal wave excitation, including the following modules:

a response signal obtaining module configured to obtain response voltage signals of n SPIO standard products under trapezoidal wave excitation and a response voltage signal of a to-be-tested sample formed by any composition of the n SPIO standard products under trapezoidal wave excitation;

a magnetization curve generating module configured to separately grid the response voltage signals according to a moving track of a magnetic excitation region in a field of view, average voltage signals of the SPIO standard products in a central grid of the field of view based on an excitation cycle to obtain magnetization curves corresponding to the n SPIO standard products, and average voltage signals in each grid of the to-be-tested sample based on the excitation cycle to obtain a magnetization curve corresponding to each grid;

a hysteresis inertia coefficient obtaining module configured to solve hysteresis inertia coefficients of the n SPIO standard products according to an inertial growth relationship between the magnetization curves corresponding to the n SPIO standard products and the hysteresis inertia coefficients;

a to-be-tested sample quality solution module configured to select points of n moments, including an initial moment and an end moment of a high amplitude holding phase of trapezoidal waves from the magnetization curve corresponding to grid r of the to-be-tested sample; construct an equation set of quality of n SPIOs with reference to the hysteresis inertia coefficients of the n SPIO standard products, and solve the equation set; and traverse r grids to obtain the quality distribution of the to-be-tested sample: $m_1(r)$, $m_2(r)$, . . . , $m_n(r)$; and a multi-color quantitative magnetic particle imaging module configured to assign a different color to each SPIO and perform quality rearrangement and distribution image merging on the quality distribution $m_1(r), m_2(r), \ldots, m_n(r)$ of the to-be-tested sample to obtain a multi-color quantitative magnetic nanoparticle image.

Those skilled in the art should clearly understand that, for convenience and brevity of description, reference is made to corresponding processes in the above method embodiments for specific working processes and related description of the system, and details are not described herein again.

It should be noted that the multi-color quantitative magnetic nanoparticle imaging system based on trapezoidal wave excitation provided by the above embodiments is only described by the above separate functional modules as an example. In practical applications, the above functions can be completed by different functional modules as required, that is, the modules or steps in the embodiments of the present disclosure are further decomposed or combined. For example, the modules of the above embodiments may be combined into one module or may be further divided into multiple sub-modules to complete all or part of the functions described above. The names of the modules and steps involved in the embodiments of the present disclosure are only for distinguishing each module or step and should not be regarded as limitations on the present disclosure.

A third embodiment of the present disclosure provides an electronic device. The electronic device includes:

at least one processor; and a memory in communication connection with the at least one processor, where the memory stores instructions executable by the processor, and the processor is executed by the processor to implement the foregoing multi-color quantitative magnetic nanoparticle imaging method based on trapezoidal wave excitation.

A fourth embodiment of the present disclosure provides a computer-readable storage medium. The computer-readable storage medium stores computer instructions, and the computer instructions are configured to be executed by a computer to implement the foregoing multi-color quantitative magnetic nanoparticle imaging method based on trapezoidal wave excitation.

Those skilled in the art should clearly understand that, for convenience and brevity of description, reference is made to corresponding processes in the above method embodiments for specific working processes and related description of the storage device and processing device, and details are not described herein again.

Those skilled in the art should be aware that the modules and method steps of the examples described in the embodiments disclosed herein may be implemented by electronic hardware, computer software, or a combination thereof. The programs corresponding to software modules and method steps may be placed in a random access memory (RAM), an internal memory, a read-only memory (ROM), an electrically programmable ROM, an electrically erasable programmable (ROM), registers, a hard disk, a removable disk, a compact disc read-only memory (CD-ROM), or in any other form of a storage medium known in the technical field. In order to clearly illustrate the interchangeability of the electronic hardware and software, the composition and steps of each example are generally described in accordance with the function in the above description. Whether the functions are performed by electronic hardware or software depends on particular applications and design constraints of the technical solutions. Those skilled in the art may use different methods to implement the described functions for each specific application, but such implementation should not be considered to be beyond the scope of the present disclosure.

Terms such as "first" and "second" are intended to distinguish between similar objects, rather than describe or indicate a specific order or sequence.

Terms "include," "comprise," or any other variations thereof are intended to cover non-exclusive inclusions, so that a process, a method, an article, or a device/apparatus including a series of elements not only includes those elements, but also includes other elements that are not explicitly listed or also includes inherent elements of the process, the method, the article, or the device/apparatus.

The technical solutions of the present disclosure are described with reference to the preferred implementations and drawings. Those skilled in the art should easily understand that the protection scope of the present disclosure is not limited to these specific implementations. Those skilled in the art can make equivalent changes or substitutions to the relevant technical features without departing from the principles of the present disclosure, and the technical solutions derived by making these changes or substitutions should fall within the protection scope of the present disclosure.

What is claimed is:

1. A multi-color quantitative magnetic nanoparticle imaging method based on trapezoidal wave excitation, comprising:

step S10, obtaining response voltage signals $u_1, u_2, \ldots, u_n$ of n superparamagnetic iron oxide nanoparticle (SPIO) standard products under trapezoidal wave excitation and a response voltage signal $u_{meas}$ of a to-be-tested sample formed by any composition of the n SPIO standard products under trapezoidal wave excitation;

step S20, separately gridding the response voltage signals $u_1, u_2, \ldots, u_n$ and $u_{meas}$ according to a moving track of a magnetic excitation region in a field of view, averaging voltage signals of the SPIO standard products in a central grid of the field of view based on an excitation cycle to obtain magnetization curves corresponding to the n SPIO standard products, and averaging voltage signals in each grid of the to-be-tested sample based on the excitation cycle to obtain a magnetization curve corresponding to each grid;

step S30, solving hysteresis inertia coefficients of the n SPIO standard products according to an inertial growth relationship between the magnetization curves corresponding to the n SPIO standard products and the hysteresis inertia coefficients;

step S40, selecting points of n moments comprising an initial moment and an end moment of a high amplitude holding phase of trapezoidal waves from the magnetization curve corresponding to the to-be-tested sample at position r; constructing an equation set of quality of n SPIOs with reference to the hysteresis inertia coefficients of the n SPIO standard products; and solving the equation set to obtain a quality distribution of the to-be-tested sample at position r: $m_1(r), m_2(r), \ldots, m_n(r)$; and step S50, assigning a different color to each SPIO standard product and performing quality rearrangement and distribution image merging on the quality distribution $m_1(r), m_2(r), \ldots, m_n(r)$ of the to-be-tested sample to obtain a multi-color quantitative magnetic nanoparticle image.

2. The multi-color quantitative magnetic nanoparticle imaging method based on trapezoidal wave excitation according to claim 1, wherein the trapezoidal waves are generated by a trapezoidal wave excitation module;

a rise time $t_u$, a holding time $t_k$, and a cycle $T_d$ of the trapezoidal waves are adjusted by using a resistance value and a capacitance value in the trapezoidal wave excitation module; and a maximum value $V_{out}$ of the trapezoidal waves is adjusted by using a reference input voltage $V_{ref}$ of the trapezoidal wave excitation module.

3. The multi-color quantitative magnetic nanoparticle imaging method based on trapezoidal wave excitation according to claim 1, wherein in step S10, the response voltage signals of the n SPIO standard products under trapezoidal wave excitation are obtained by using the following method:

preparing the n SPIO standard products in multi-color quantitative magnetic particle imaging, wherein each SPIO standard product has an ion concentration of 0.2 mg/mL and a volume of 0.1 mL;

placing any one of the SPIO standard products at a center of a field of view of a multi-color quantitative magnetic particle imaging system;

obtaining a response voltage signal of the current SPIO standard product through mobile scanning measurement by the magnetic excitation region in the field of view; and traversing the n SPIO standard products to obtain the response voltage signals $u_1, u_2, \ldots, u_n$.

4. The multi-color quantitative magnetic nanoparticle imaging method based on trapezoidal wave excitation according to claim 1, wherein in step S10, the response voltage signal of the to-be-tested sample under trapezoidal wave excitation is obtained by using the following method:

mixing the n SPIO standard products based on any composition to obtain the to-be-tested sample formed by the n SPIO standard products, wherein a total iron content of each SPIO is unknown and distribution of SPIOs is unknown;

placing the to-be-tested sample at a center of a field of view of a multi-color quantitative magnetic particle imaging system; and obtaining a response voltage signal $u_{meas}$ of the to-be-tested sample through mobile scanning measurement by the magnetic excitation region in the field of view.

5. The multi-color quantitative magnetic nanoparticle imaging method based on trapezoidal wave excitation according to claim 1, wherein in step S20, the magnetization curves corresponding to the n SPIO standard products are obtained by using the following method:

step S201, gridding the response voltage signals $u_1, u_2, \ldots, u_n$ of the n SPIO standard products under trapezoidal wave excitation with reference to the moving track of the magnetic excitation region in the field of view to discretize each of the response voltage signals $u_1, u_2, \ldots, u_n$ into a plurality of sections;

step S202, selecting discrete response voltage signals in the central grid of the field of view, and averaging, according to a plurality of excitation cycles of the signals, the signals in the plurality of excitation cycles to be signals of one cycle; and step S203, integrating the averaged response voltage signals to obtain magnetization curves $M_1(t), M_2(t), \ldots, M_n(t)$ corresponding to the n SPIO standard products.

6. The multi-color quantitative magnetic nanoparticle imaging method based on trapezoidal wave excitation according to claim 5, wherein in step S20, the magnetization curve corresponding to each grid is obtained by using the following method:

step S211, gridding the response voltage signal $u_{meas}$ of the to-be-tested sample under trapezoidal wave excitation with reference to the moving track of the magnetic excitation region in the field of view to discretize the response voltage signal $u_{meas}$ into a plurality of sections;

step S212, selecting discrete response voltage signals in grid r, and averaging, according to a plurality of excitation cycles of the signals, the signals in the plurality of excitation cycles to be signals of one cycle;

step S213, integrating the averaged response voltage signals to obtain a magnetization curve $M_{meas}(r, t)$ corresponding to grid r; and step S214, traversing r grids to obtain a magnetization curve corresponding to each grid.

7. The multi-color quantitative magnetic nanoparticle imaging method based on trapezoidal wave excitation according to claim 6, wherein step S30 comprises:

step S31, for an $i^{th}$ SPIO standard product in the n SPIO standard products, inertially increasing a magnetization vector $M_i(0)$ by using a hysteresis inertia coefficient $a_i$:

wherein at the initial moment t=0 of the high amplitude holding phase of the trapezoidal waves, the magnetization vector of the $i^{th}$ SPIO standard product varies over time as follows:

$$M_i(t) = M_i(0) + \frac{1}{2}a_i t; \text{ and}$$

at the end moment $t=t_k$ of the high amplitude holding phase of the trapezoidal waves, the magnetization vector of the $i^{th}$ SPIO standard varies over time as follows:

$$M_i(t_k) = M_i(0) + \frac{1}{2}a_i t_k;$$

step S32, solving an inertia coefficient $a_i$ of the $i^{th}$ SPIO standard product based on the magnetization vectors $M_i(0)$ and $M_i(t_k)$ and $t_k$; and step S33, traversing the n SPIO standard products to obtain hysteresis inertia coefficients $a_1, a_2, \ldots, a_n$ of the n SPIO standard products.

8. The multi-color quantitative magnetic nanoparticle imaging method based on trapezoidal wave excitation according to claim 1, wherein the equation set of the quality of the n SPIOs is as follows:

$$\begin{cases} M_{meas}(r, t|_{t=0}) = \sum_{i=1}^{n} m_i(r)M_i(0) \\ M_{meas}(r, t|_{t=t_1}) = M_{meas}(r, t|_{t=0}) + \frac{1}{2}t_1\left(\sum_{i=1}^{n} m_i(r)a_i\right) \\ \ldots \\ M_{meas}(r, t|_{t=t_{n-2}}) = M_{meas}(r, t|_{t=0}) + \frac{1}{2}t_{n-2}\left(\sum_{i=1}^{n} m_i(r)a_i\right) \\ M_{meas}(r, t|_{t=t_k}) = M_{meas}(r, t|_{t=0}) + \frac{1}{2}t_k\left(\sum_{i=1}^{n} m_i(r)a_i\right) \end{cases}$$

wherein t=0 represents the initial moment of the high amplitude holding phase of the trapezoidal waves; $t=t_k$ represents the end moment of the high amplitude holding phase of the trapezoidal waves; $t=t_1, \ldots t=t_{n-2}$ represents n−2 moments from the initial moment t=0 to the end moment $t=t_k$; $M_i(0)$ represents a magnetization vector of an $i^{th}$ SPIO at the moment t=0, wherein i=1, 2, ..., n; $m_i(r)$ represents a quality of the $i^{th}$ SPIO at position r, wherein i=1, 2, ..., n; and $a_i$ represents a hysteresis inertia coefficient of the $i^{th}$ SPIO, wherein i=1, 2, ..., n.

9. The multi-color quantitative magnetic nanoparticle imaging method based on trapezoidal wave excitation according to claim 1, wherein step S50 comprises:

step S51, assigning a different color to each SPIO;

step S52, rearranging quality $m_1(r), m_2(r), \ldots, m_n(r)$ of the to-be-tested sample at position r according to the moving track of the magnetic excitation region in the field of view to obtain quantitative distribution images $IMG_1, IMG_2, \ldots, IMG_n$; and step S53, merging the quantitative distribution images $IMG_1, IMG_2, \ldots, IMG_n$ to obtain the multi-color quantitative magnetic nanoparticle image $IMG_{merge}$.

10. A multi-color quantitative magnetic nanoparticle imaging system based on trapezoidal wave excitation, comprising the following modules:

a response signal obtaining module configured to obtain response voltage signals $u_1, u_2, \ldots, u_n$ of n SPIO standard products under trapezoidal wave excitation and a response voltage signal $u_{meas}$ of a to-be-tested sample formed by any composition of the n SPIO standard products under trapezoidal wave excitation;

a magnetization curve generating module configured to separately grid the response voltage signals $u_1, u_2, \ldots, u_n$ and $u_{meas}$ according to a moving track of a magnetic excitation region in a field of view, average voltage signals of the SPIO standard products in a central grid of the field of view based on an excitation cycle to obtain magnetization curves corresponding to the n SPIO standard products, and average voltage signals in each grid of the to-be-tested sample based on the excitation cycle to obtain a magnetization curve corresponding to each grid;

a hysteresis inertia coefficient obtaining module configured to solve hysteresis inertia coefficients of the n SPIO standard products according to an inertial growth relationship between the magnetization curves corresponding to the n SPIO standard products and the hysteresis inertia coefficients;

a to-be-tested sample quality solution module configured to select points of n moments comprising an initial moment and an end moment of a high amplitude holding phase of trapezoidal waves from the magnetization curve corresponding to grid r of the to-be-tested sample; construct an equation set of quality of n SPIOs with reference to the hysteresis inertia coefficients of the n SPIO standard products, and solve the equation set; and traverse r grids to obtain quality distribution of the to-be-tested sample: $m_1(r), m_2(r), \ldots, m_n(r)$; and a multi-color quantitative magnetic particle imaging module configured to assign a different color to each SPIO standard product and perform quality rearrangement and distribution image merging on the quality distribution $m_1(r), m_2(r), \ldots, m_n(r)$ of the to-be-tested sample to obtain a multi-color quantitative magnetic nanoparticle image.

* * * * *